(12) United States Patent
Blauvelt et al.

(10) Patent No.: US 7,492,024 B2
(45) Date of Patent: Feb. 17, 2009

(54) REFLECTOR FOR A DOUBLE-PASS PHOTODETECTOR

(75) Inventors: Henry A. Blauvelt, San Marino, CA (US); Joel S. Paslaski, San Gabriel, CA (US); Rolf A. Wyss, Glendale, CA (US)

(73) Assignee: HOYA Corporation USA, San Jose, CA (US)

( * ) Notice: Subject to any disclaimer, the term of this patent is extended or adjusted under 35 U.S.C. 154(b) by 0 days.

(21) Appl. No.: 11/456,294

(22) Filed: Jul. 10, 2006

(65) Prior Publication Data

US 2007/0013020 A1  Jan. 18, 2007

Related U.S. Application Data

(60) Provisional application No. 60/699,814, filed on Jul. 15, 2005.

(51) Int. Cl.
 *H01L 33/00* (2006.01)
(52) U.S. Cl. .................... 257/432; 257/447; 257/460; 257/E31.127
(58) Field of Classification Search ................ 257/432, 257/436, 447, 458, 459, 460, E31.123, E31.127
 See application file for complete search history.

(56) References Cited

U.S. PATENT DOCUMENTS

| | | | |
|---|---|---|---|
| 6,667,528 B2 * | 12/2003 | Cohen et al. | 257/469 |
| 2003/0164444 A1 * | 9/2003 | Yoneda et al. | 250/214.1 |
| 2003/0178636 A1 * | 9/2003 | Kwan et al. | 257/186 |
| 2004/0129935 A1 * | 7/2004 | Blauvelt et al. | 257/40 |

* cited by examiner

*Primary Examiner*—Minh-Loan T Tran
(74) *Attorney, Agent, or Firm*—David S. Alavi

(57) ABSTRACT

An apparatus comprises: a substrate; a photodetector formed on an area of a surface of the substrate; an electrical contact formed on a portion of the photodetector; and a reflector formed over a portion of the photodetector distinct from the portion of the photodetector having the electrical contact formed thereon. The substrate, the photodetector, and the reflector are arranged so that an optical signal to be detected is incident on the photodetector from within the substrate, and at least a portion of the optical signal incident on the photodetector and transmitted thereby on a first pass is reflected by the reflector to propagate through the photodetector for a second pass.

16 Claims, 5 Drawing Sheets

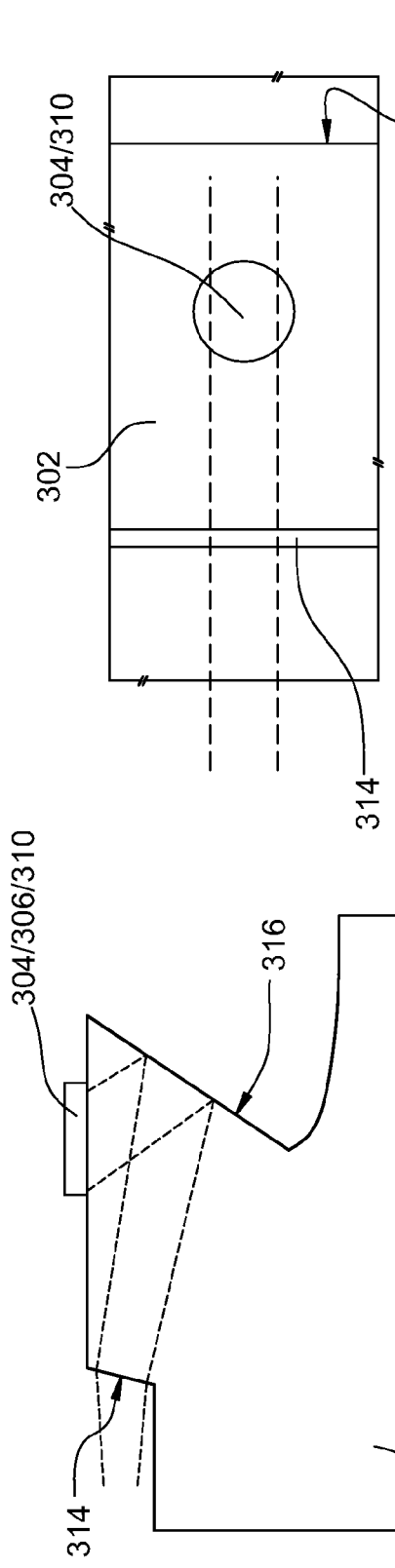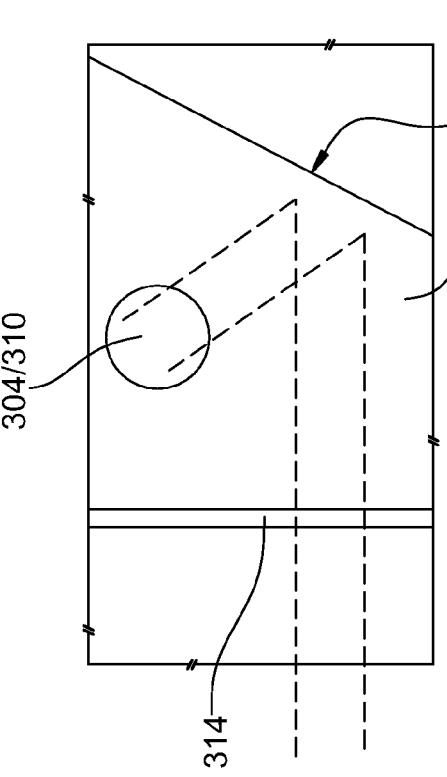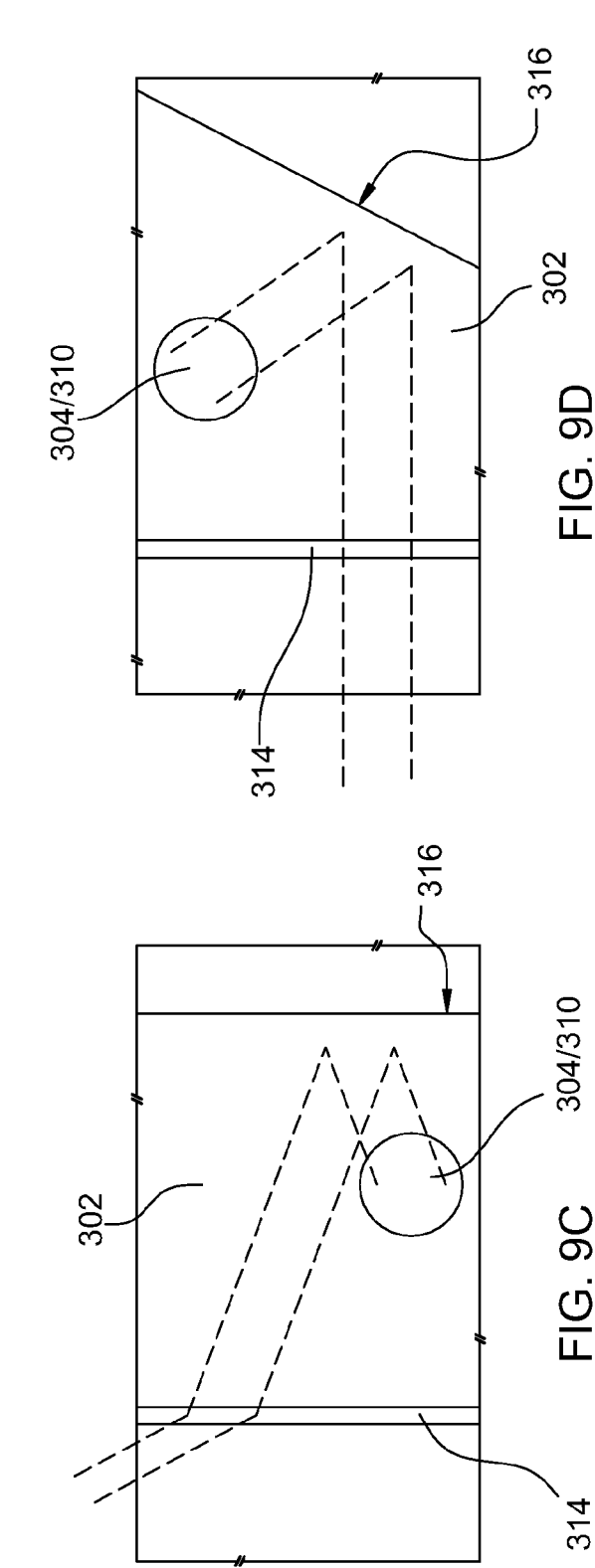

US 7,492,024 B2

REFLECTOR FOR A DOUBLE-PASS PHOTODETECTOR

This application claims benefit of U.S. provisional App. No. 60/699,814 filed 07/15/2005, said provisional application being hereby incorporated by reference as if fully set forth herein.

BACKGROUND

The field of the present invention relates to semiconductor-based photodetectors. In particular, a reflector for a double-pass photodetector is disclosed herein.

Semiconductor-based photodetectors are well known, and typically comprise multiple layers of suitably doped semiconductor materials formed on a substrate. The doped photodetector layers are arranged so that absorption of light results in generation of charge carriers, which in turn gives rise to electrical signals substantially proportional to the amount of light absorbed. The efficiency or responsivity of the photodetector is proportional to the absorbance of its layers. In common detector geometries, it is often the case that the light to be detected propagates outside the substrate before impinging on the photodetector layers. In this front-illuminated arrangement, incident light that is not absorbed by the photodetector layers propagates into the substrate and is lost.

In other detector geometries, the light to be detected propagates within the substrate before impinging on the photodetector layers. Examples of such detector geometries may be found in, for example, in: i) Fukano et al, Electron. Lett. Vol. 32 No. 25 p. 2346 (December 1996); ii) Fukano et al, J. Lightwave Tech. Vol. 15 No. 5 p. 894 (May 1997); iii) Fukano et al, J. Lightwave Tech. Vol. 18 No. 1 p. 79 (January 2000); iv) Kato et al, IEEE Photonics Tech. Lett. Vol. 11 No. 6 p. 709 (June 1999); v) U.S. Pat. No. 6,353,250; vi) U.S. Pat. No. 6,770,945; and vii) U.S. Patent Pub. No. US-2004-0129935-A1. In this back-illuminated arrangement, incident light that is not absorbed by the photodetector layers either escapes the photodetector and substrate, or is incident on any layers that may be present over the photodetector layers.

In cases wherein detector responsivity is at a premium, or the absorbance of the photodetector layers is lower than may be desired at a wavelength of interest, a back-illuminated photodetector geometry affords an opportunity to increase overall photodetector responsivity. Therefore, it may be desirable to form a reflector over the photodetector layers for reflecting at least a portion of light transmitted by the photodetector layers for a second pass through the photodetector layers.

SUMMARY

An apparatus comprises: a substrate; a photodetector formed on an area of a surface of the substrate; an electrical contact formed on a portion of the photodetector; and a reflector formed over a portion of the photodetector distinct from the portion of the photodetector having the electrical contact formed thereon. The substrate, the photodetector, and the reflector are arranged so that an optical signal to be detected is incident on the photodetector from within the substrate, and at least a portion of the optical signal incident on the photodetector and transmitted thereby on a first pass is reflected by the reflector to propagate through the photodetector for a second pass.

Objects and advantages pertaining to reflectors for photodetectors may become apparent upon referring to the exemplary embodiments illustrated in the drawings and disclosed in the following written description and/or claims.

BRIEF DESCRIPTION OF THE DRAWINGS

FIGS. 9A, 9B, 9C, and 9D are schematic views (cross-sectional, top, alternate top, and another alternate top, respectively) of a back-illuminated photodetector with a reflector, an entrance face, and an internally-reflecting face.

In one or more of the drawings, layer thicknesses may be exaggerated for clarity. In one or more of the drawings, a single illustrated layer may represent two or more layers. The embodiments shown in the Figures are exemplary, and should not be construed as limiting the scope of the present disclosure or the appended claims.

DETAILED DESCRIPTION OF EMBODIMENTS

Figure 1:
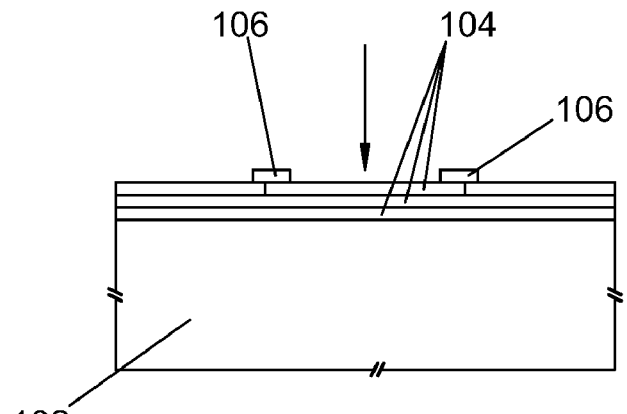
FIG. 1 is a schematic cross-sectional view of a prior art front-illuminated photodetector.

A typical photodetector arrangement is shown in FIG. 1, comprising various doped or intrinsic semiconductor layers 104 formed on a substrate 102. Whether operated in photovoltaic mode (unbiased) or photoconductive mode (biased), absorption of incident light by the photodetector layers results in generation of charge carriers, which in turn gives rise to electrical signals substantially proportional to the amount of light absorbed. Electrical contacts 106 are provided for carrying electrical signals generated by the photodetector layers 104 and/or for biasing the photodetector layers 104. The efficiency or responsivity of the photodetector is proportional to the absorbance of its layers. In the detector geometry of FIG. 1, the light to be detected propagates outside the substrate before impinging on the photodetector layers 104. An electrical contact 106 is typically arranged so as to leave at least a portion of the photodetector unobstructed for illumination by an incident optical signal. A second required electrical contact, usually formed at a separate location on the substrate, is not shown. In this front-illuminated arrangement, a portion of the incident optical signal that is not absorbed by the photodetector layers 104 propagates into the substrate 102 and is lost.

Figure 2A:
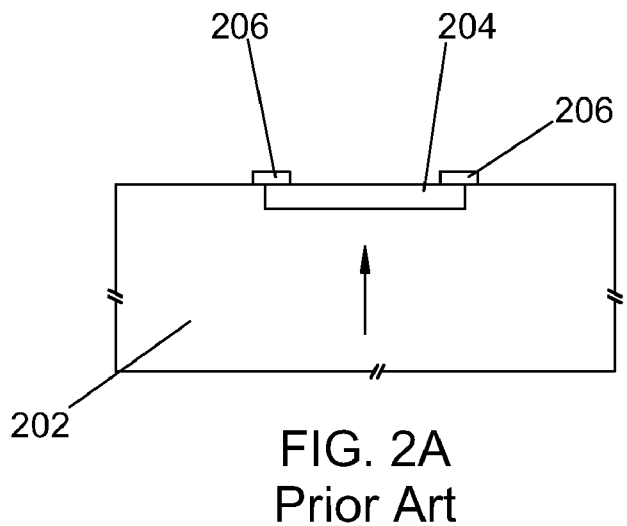
FIGS. 2A and 2B are schematic cross-sectional views of prior art back-illuminated photodetectors.
Figure 2B:
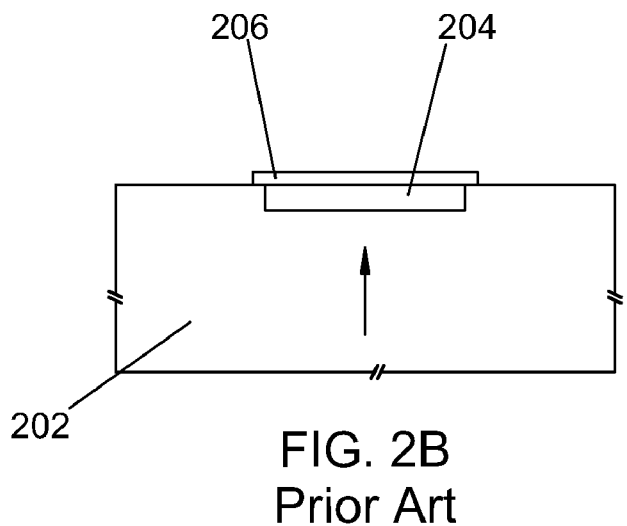

In other detector geometries (FIGS. 2A-2B), the light to be detected propagates within the substrate 202 before impinging on the photodetector layers 204 (details of photodetector layers omitted in these and subsequent Figures). In such a back-illuminated arrangement, incident light that is not absorbed either escapes the photodetector and substrate, or is incident on any additional layers that may be present over the photodetector layers 204. Such additional layer(s) may typically comprise an electrical contact 206 for carrying electrical signals generated by the photodetector layers 204 and/or for biasing photodetector layers 204. In a back-illuminated photodetector geometry, electrical contact need not be arranged to leave a portion of the detector layers 206 unobstructed, and may therefore cover most or all of the area of photodetector layers 206. If the electrical contact 206 does not cover the photodetector 204 (as in FIG. 2A), then a portion of an incident optical signal that is transmitted by the photodetector 204 escapes the photodetector 204 and substrate 202 and is lost. If the electrical contact 206 covers photodetector 204 (as in FIG. 2B), then the electrical contact 206 may provide some degree of reflectivity and direct a portion of the transmitted optical signal for a second pass back through the photodetector 204. However, layers that are often employed for providing electrical contacts to semiconductors typically do not also provide high levels of reflectivity. For example, a titanium-platinum-gold electrical contact (Ti—Pt—Au; respective thicknesses of 50 nm, 75 nm, and 300 nm, typically) is a reliable, well-characterized industry standard, but typically provides only about 20% reflectivity. Photodetector responsivity of, for example, around 1.1 A/W may be observed for a back-illuminated III-V semiconductor photodetector at about 1550 nm with a Ti—Pt—Au electrical contact covering the photodetector.

Figure 3:
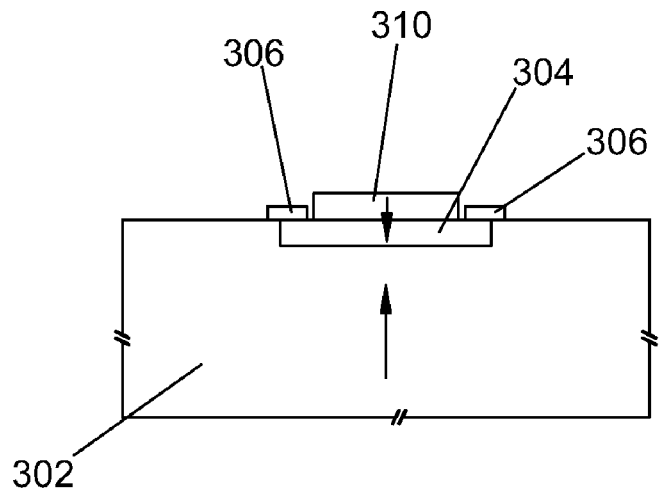
FIG. 3 is a schematic cross-sectional view of a back-illuminated photodetector with a reflector.

In the exemplary embodiment illustrated schematically in FIG. 3, photodetector layers 304 are formed on a surface of substrate 302. An electrical contact 306 is formed on a portion of the photodetector 304. A reflector 310 is formed over a portion of the photodetector 304 distinct from the portion of the photodetector having the electrical contact 306 formed thereon. The substrate 302, the photodetector 304, and the reflector 310 are arranged so that an optical signal to be detected is incident on the photodetector 304 from within the substrate 302, and at least a portion of the optical signal incident on the photodetector and transmitted thereby on a first pass is reflected by the reflector 310 to propagate through the photodetector 304 for a second pass, thereby increasing the overall responsivity of the photodetector at those wavelengths that are not substantially completely absorbed during a single pass. By forming the reflector 310 on an area of the photodetector 304 distinct from the area covered by the electrical contact 306, each may be independently designed or optimized for fulfilling its respective function. For example, standard Ti—Pt—Au may be employed for the electrical contact 306, while other structures or materials may be employed for forming reflector 310. It may typically be the case that the electrical contact 306 is formed on only a peripheral portion of photodetector 304. Such a peripherally-positioned electrical contact may surround the photodetector, or may extend around only a portion of the periphery of the photodetector, and may assume any suitable shape.

In the Figures, the electrical contact 306 and the reflector 310 are shown with a gap between them. This need not be the case however. The electrical contact 306 and reflector 310 may directly abut one another, may be separated by a gap, or may partly overlap one another. It is only required that there be distinct portions of the area of photodetector 304 that are in direct contact with the electrical contact 306 and the reflector 310, respectively.

The details of various exemplary embodiments of a reflector 310 are illustrated schematically in FIGS. 4, 5, 6A, 6B, and 7, in which the reflector is generally designated as element 310, while various constituent elements of the various exemplary embodiments of reflector 310 are separately designated in the respective Figures. In the exemplary embodiment of FIG. 4, the reflector 310 comprises at least one metal layer formed directly on the photodetector 304. In the exemplary embodiment of FIG. 5, reflector 310 comprises a single dielectric layer formed directly on the photodetector 304, and at least one metal layer formed directly on the dielectric layer. In the exemplary embodiment of FIGS. 6A and 6B, reflector 310 comprises a dielectric multilayer reflector stack formed directly on the photodetector 304, and in FIG. 6B further comprises at least one metal layer formed directly on the dielectric multilayer reflector stack. In the exemplary embodiment of FIG. 7, reflector 310 comprises a dielectric layer formed directly on the photodetector 304 and arranged for total internal reflection.

Figure 4:
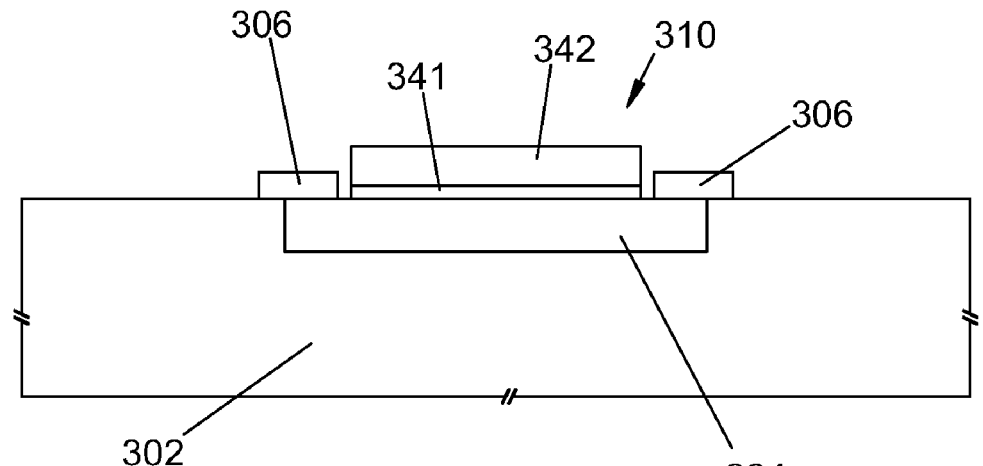
FIG. 4 is a schematic cross-sectional view of a back-illuminated photodetector with a reflector.

In the exemplary embodiment of FIG. 4, the reflector 310 comprises at least one metal layer formed directly on the photodetector 304. As noted hereinabove, standard Ti—Pt—Au electrical contact layers typically provide reflectivity of only about 20%. Other metal layers formed on the photodetector 304 may provide higher reflectivity. While Ti—Pt—Au may be employed for forming electrical contact 306, reflector 310 may comprise different metals or sequences of metals in order to provide increased reflectivity. In one exemplary embodiment conforming to FIG. 4, reflector 310 comprises a titanium layer 341 formed directly on photodetector 304, and a gold layer 342 formed directly on the titanium layer 341 (referred to as a Ti—Au reflector). Titanium layer 341 provides adhesion to the photodetector (which typically comprises one or more III-V semiconductor materials), while gold layer 342 provides reflectivity. Titanium absorbs at typical wavelengths detected by III-V semiconductor photodetectors, so the titanium layer 341 is made as thin as is practicable (thickness exaggerated in the Figures). Titanium layer 341 is usually less than about 10 nm, and may be about 3 to 5 nm in thickness, in order to provide adequate adhesion without giving rise to undue absorption. The thickness of gold layer 342 is not critical, provided it is sufficiently thick to substantially prevent light transmission therethrough (greater than around 50 nm thick; typically about 100 nm thick or more). Reflectivity of about 80% is calculated for this reflector structure, but measurements of fabricated devices typically indicate reflectivity of about 50% to 60%. It is speculated that heating of the photodetector and reflector during subsequent processing steps may degrade the reflectivity of the Ti—Au reflector. Nevertheless, use of a Ti—Au reflector 310 over the photodetector 304 has yielded responsivity of about 1.16 A/W at about 1550 nm for exemplary devices. It may be desirable to provide a reflector 310 wherein reflectivity remains above about 50% (and responsivity remains above about 1.15 A/W at about 1550 nm) after heating the photodetector to above about 300° to 350° for intervals of about an hour or more, or after heating the photodetector to about 380° for intervals of about 30 seconds or more. A photodetector with a metal reflector wherein: the photodetector comprises any suitable material; the reflector comprises any suitable metal layer or combination of metal layers; or the photodetector responsivity assumes other values, shall fall within the scope of the present disclosure or appended claims.

Figure 5:
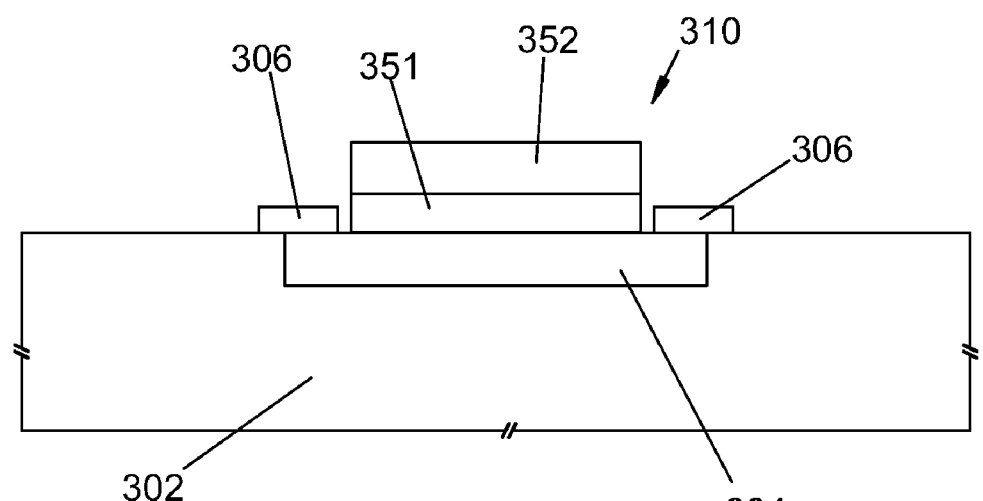
FIG. 5 is a schematic cross-sectional view of a back-illuminated photodetector with a reflector.

In the exemplary embodiment of FIG. 5, reflector 310 comprises a single dielectric layer 351 formed directly on the photodetector 304, and at least one metal layer 352 formed directly on the dielectric layer 351. Any suitable dielectric material may be employed for forming layer 351, including silicon nitride ($SiN_x$), silicon oxide (i.e. silica; $SiO_x$), silicon oxynitride ($SiO_xN_y$), aluminum oxide ($AlO_x$), titanium oxide ($TiO_x$), tantalum oxide ($TaO_x$), or any other dielectric material compatible with the materials of photodetector 304 and having a suitable refractive index. The thickness of dielectric layer 351 is selected based on its index and the desired operating wavelength range of the photodetector to achieve enhanced reflectivity through constructive interference of optical signals reflected from the photodetector-dielectric interface and from the dielectric-metal interface. A dielectric material may be chosen based on processing or fabrication characteristics, based on compatibility with the photodetector materials or the metal reflector materials, or for providing a refractive index in a desired range based on desired angle of incidence or desired reflectivity. For example, on a III-V semiconductor photodetector operating over a wavelength range between about 1400 nm and about 1650 nm incident at about 20°, a layer of silicon nitride about 200 nm thick with a metal reflector yields improved reflectivity relative to a metal reflector alone, while in another example a layer of silicon oxide about 280 nm thick yields similarly improved reflectivity. For non-normal incidence, potential polarization dependence of the overall reflectivity must be considered, and a particular angle of incidence may dictate a maximum index contrast between the photodetector 304 and the dielectric layer 351 for which the polarization dependence remains within an operationally acceptable limit.

The metal layer 352 in one example of the embodiment of FIG. 5 comprises a Ti—Au reflector as described above. Fabricated devices with a silicon nitride dielectric layer 351 and a Ti—Au metal layer 352 have exhibited responsivity of about 1.18-1.19 A/W at about 1550 nm, which does not appear to degrade with subsequent heating or processing of the device. The metal layer 352 in another example of the embodiment of FIG. 5 comprises an aluminum layer. Fabricated devices with a silicon nitride layer 351 and an aluminum metal layer 352 have exhibited responsivity of up to about 1.22 A/W at about 1550 nm. The aluminum layer 352 is sufficiently thick so as to substantially eliminate any transmission of an optical signal therethrough (greater than around 50 nm thick; typically around 100 nm to 200 nm thick or more). A photodetector with a dielectric layer and a metal layer wherein: the photodetector comprises any suitable material; the dielectric layer comprises any suitable material or any suitable thickness; the reflector comprises any suitable metal layer or combination of metal layers; or the photodetector responsivity assumes other values, shall fall within the scope of the present disclosure or appended claims.

Figure 6A:
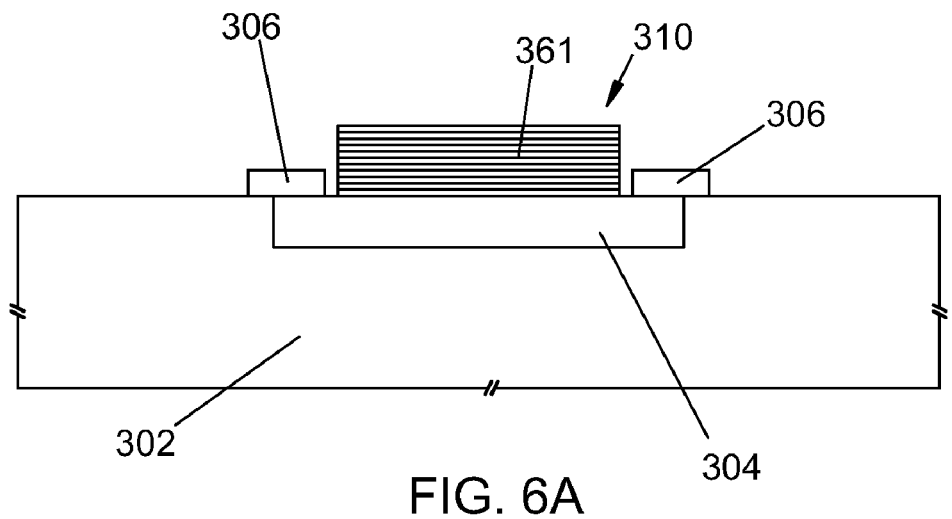
FIGS. 6A and 6B are schematic cross-sectional views of a back-illuminated photodetector with a reflector.
Figure 6B:
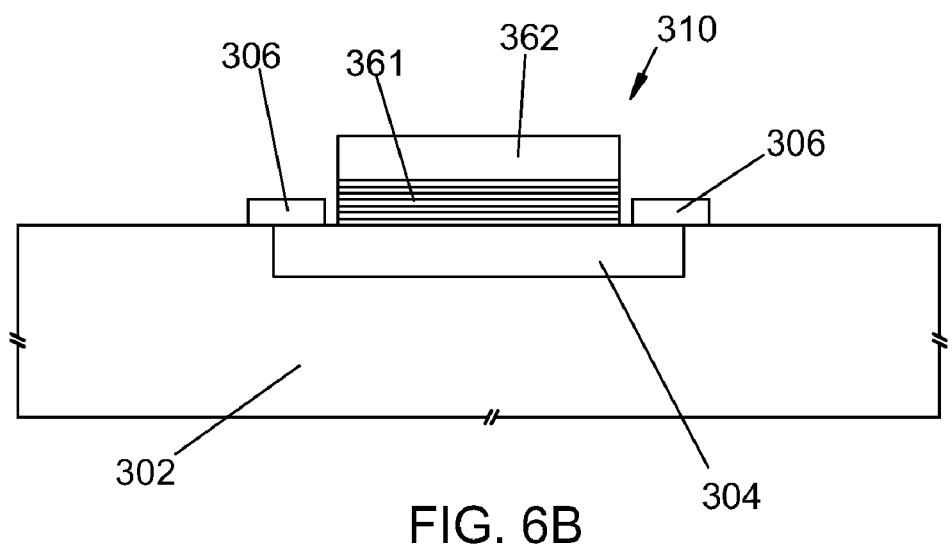

In the exemplary embodiment of FIGS. 6A and 6B, reflector 310 comprises a dielectric multilayer reflector stack 361 formed directly on the photodetector 304, and in FIG. 6B reflector 310 further comprises at least one metal layer 362 formed directly on the dielectric multilayer reflector stack 361. The multilayer reflector stack 361 may comprise alternating λ/4 layers of any two suitable dielectric materials (layer thicknesses exaggerated in the Figures), and may be designed according to standard techniques. For example, two dielectric materials chosen from a group consisting of silicon, silicon oxide, silicon nitride, and silicon oxynitride may form the alternating layers of the reflector stack (e.g. alternating layers of silicon and silicon nitride). The multilayer reflector stack may be designed subject to any desired or required criteria, such as reflectivity, photodetector responsivity, operational wavelength range, angle of incidence, polarization dependence or independence, fabrication cost or complexity, and so on. The multilayer reflector stack 361 may be employed alone (as in FIG. 6A) if it provides operational acceptable reflectivity or photodetector responsivity. Sufficiently many layers may be formed to reduce the fraction of optical signal transmitted by the multilayer reflector stack below an operationally acceptable level. Alternatively, a metal 11 layer 362 may be formed over the multilayer reflector stack 361 (as in FIG. 6B) for reflecting a portion of an optical signal transmitted by the multilayer reflector stack 361. The metal layer 362 may result in operationally acceptable reflectivity or responsivity with fewer layers in reflector stack 361 (thereby simplifying fabrication). The reflectivity of the metal layer 362 influences the overall reflectivity and responsivity to a lesser degree in the embodiment of FIG. 6B than in other embodiments described hereinabove, allowing various metal layers to be employed, such as Ti—Pt—Au, Ti—Au, aluminum, and so forth.

Figure 7:
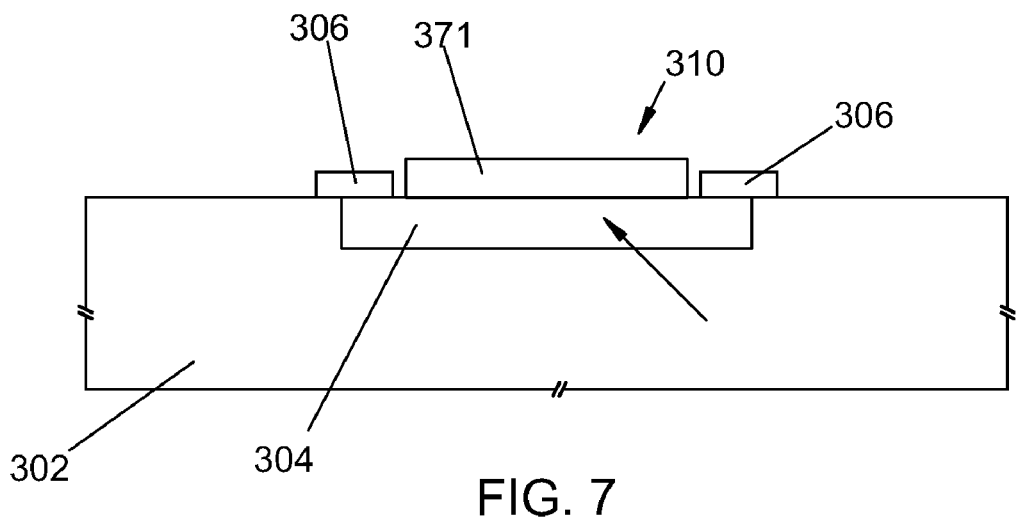
FIG. 7 is a schematic cross-sectional view of a back-illuminated photodetector with a reflector.

In the exemplary embodiment of FIG. 7, reflector 310 comprises a dielectric layer 371 formed directly on the photodetector 304 and arranged for total internal reflection. Any suitable dielectric material may be employed for forming layer 371, such as silicon oxide, silicon nitride, silicon oxynitride, aluminum oxide, titanium oxide, tantalum oxide, polymer, and so on. The substrate 302, photodetector 304, and dielectric layer 371 are arranged to that the portion of an optical signal transmitted by the photodetector 304 is incident on the photodetector-dielectric interface at an angle of incidence exceeding the critical angle and undergoes total internal reflection. Choosing a dielectric material for layer 371 having a lower refractive index enables total internal reflection from the photodetector-dielectric interface at a relatively lower angle of incidence, and may facilitate suitable arrangement of the substrate 302 and photodetector 304. Dielectric layer 371 is sufficiently thick so as to substantially avoid interaction of any evanescent optical field arising from the interface between photodetector 304 and layer 371 with the opposite surface of layer 371. Layer 371 is thicker than about 100 nm, and is typically 200 nm or more on thickness.

Figure 8A:
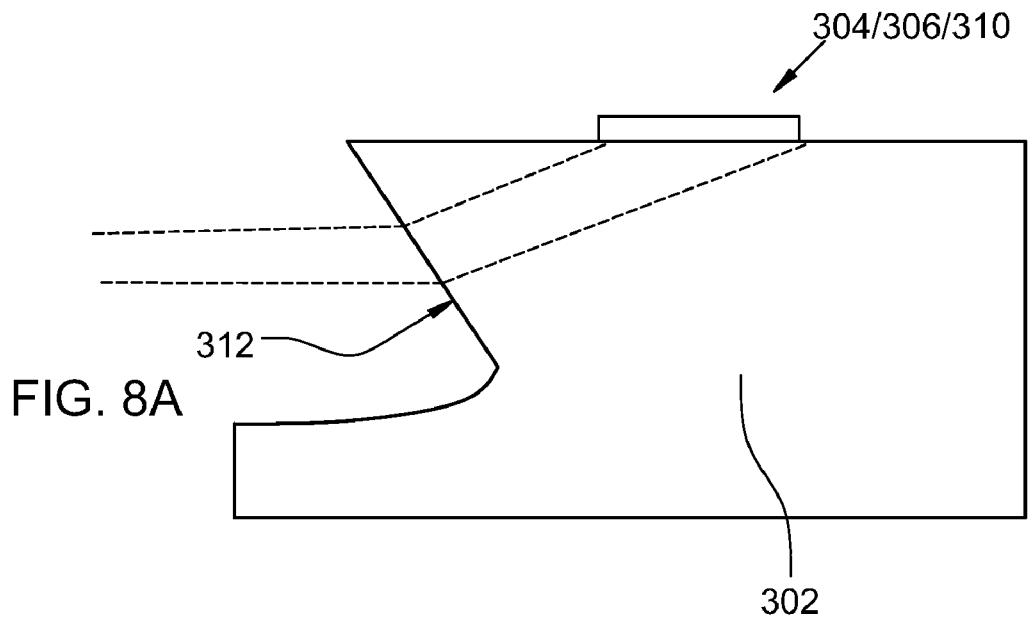
FIGS. 8A, 8B, and 8C are schematic views (cross-sectional, top, and alternate top, respectively) of a back-illuminated photodetector with a reflector and a refractive entrance face.
Figure 8B:
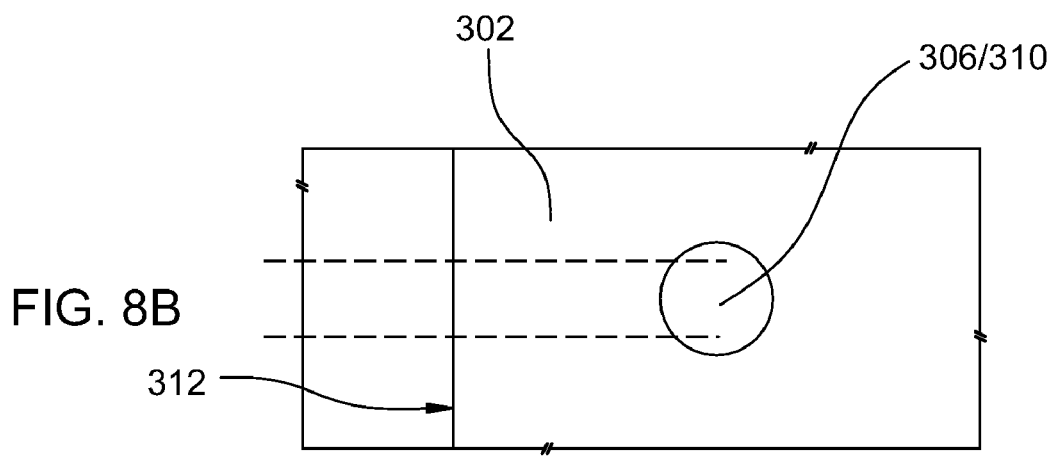
Figure 8C:
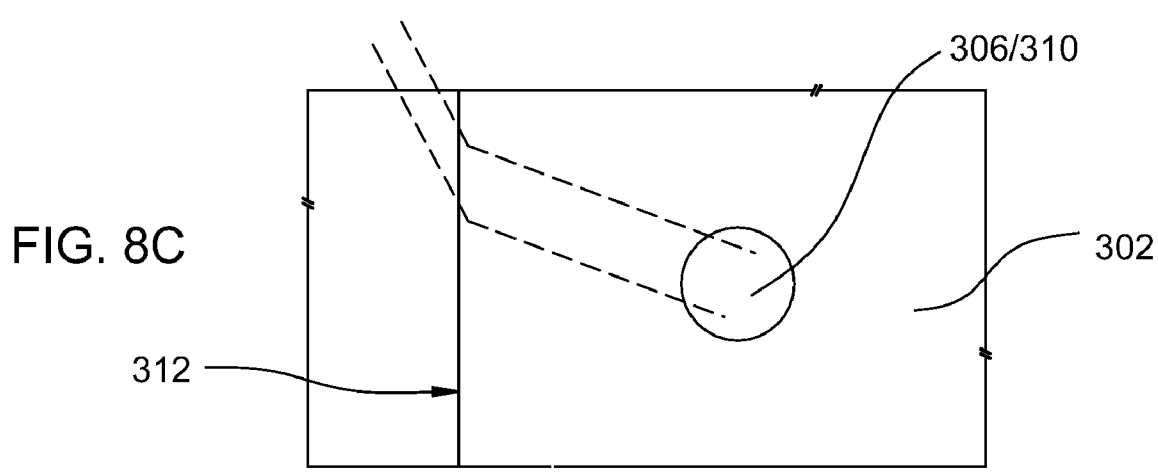

For all embodiments, substrate 302 and photodetector 304 may be arranged in any suitable manner for back-illumination of the photodetector by an optical signal incident on the photodetector from within the substrate. A simple arrangement may include transmission of the optical signal through an opposing surface of the substrate 302 and propagation through the substrate to photodetector 304. In other embodiments, substrate 302 may include a refractive entrance face 312 for directing an optical signal toward the photodetector (as in the exemplary embodiment of FIG. 8A), or substrate 302 may include an entrance face 314 and a reflecting face 316 for directing an optical signal toward the photodetector by internal reflection (as in the exemplary embodiment of FIG. 9A). In both of these embodiments, the planes of incidence for the various entrance and reflecting faces may be substantially vertical, resulting in a substantially "in-line" geometry (as in FIGS. 8B and 9B), or the planes of incidence may be skewed to alter the angles of incidence on the various faces and on the photodetector, resulting in a "kewed" geometry (as in FIGS. 8C, 9C, and 9D). Such a skewed geometry may offer more flexibility in achieving a desired angle of incidence on the photodetector (for achieving total internal reflection from reflector 310, for example), particularly in cases wherein entrance or reflecting faces are defined by crystal planes of the substrate 302.

The phrase "operationally acceptable" appears herein describing levels of reflectivity or responsivity associated with a photodetector with a reflector. An operationally acceptable level may be determined by any relevant set or subset of applicable constraints or requirements arising from the performance, fabrication, device yield, assembly, testing, availability, cost, supply, demand, or other factors surrounding the manufacture, deployment, or use of a photodetector. Such "operationally acceptable" levels may therefore vary depending on such constraints or requirements. For example, a lesser degree of reflectivity or responsivity may be an acceptable trade-off for achieving lower device fabrication costs in some instances, while a greater degree of reflectivity or responsivity may be required in other instances in spite of higher fabrication costs. Other examples of such trade-offs may be imagined. Photodetectors with reflectors as disclosed herein, and equivalents thereof, may therefore be implemented within tolerances of varying precision depending on such "operationally acceptable" constraints or requirements. Phrases such as "substantially complete reflection" and so forth as used herein shall be construed in light of this notion of "operationally acceptable" performance.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: i) it is explicitly stated otherwise, e.g., by use of "either . . . or", "only one of . . . ", or similar language; or ii) two or more of the listed alternatives are mutually exclusive within the particular context, in which case "or" would encompass only those combinations involving non-mutually-exclusive alternatives. It is intended that equivalents of the disclosed exemplary embodiments and methods shall fall within the scope of the present disclosure and/or appended claims. It is intended that the disclosed exemplary embodiments and methods, and equivalents thereof, may be modified while remaining within the scope of the present disclosure or appended claims.

For purposes of the present disclosure or appended claims, the words "include", "including", and so on shall be construed as being open-ended, e.g., "including"shall be construed as "including but not limited to".

What is claimed is:

1. An apparatus, comprising:
   a substrate;
   a photodetector formed on an area of a surface of the substrate;
   an electrical contact formed on a portion of the photodetector; and
   a reflector formed over a portion of the photodetector distinct from the portion of the photodetector having the electrical contact formed thereon,
   wherein:
   the substrate, the photodetector, and the reflector are arranged so that an optical signal to be detected is incident on the photodetector from within the substrate, and at least a portion of the optical signal incident on the photodetector and transmitted thereby on a first pass is reflected by the reflector to propagate through the photodetector for a second pass; and
   the reflector comprises at least one metal layer electrically insulated from the electrical contact.

2. The apparatus of claim 1, wherein the substrate includes a reflecting face formed thereon and arranged for directing by internal reflection the optical signal onto the photodetector for the first pass.

3. The apparatus of claim 2, wherein the reflecting face is arranged for directing by total internal reflection the optical signal onto the photodetector for the first pass.

4. The apparatus of claim 1, wherein the electrical contact is formed on only a peripheral portion of the photodetector.

5. The apparatus of claim 1, wherein the reflector comprises a single dielectric layer formed directly on the photodiode, and at least one metal layer formed directly on the dielectric layer.

6. The apparatus of claim 1, wherein the reflector comprises a dielectric multilayer reflector stack formed directly on the photodetector.

7. The apparatus of claim 6, wherein the dielectric multilayer reflector stack comprises alternating layers of silicon nitride and silicon.

8. The apparatus of claim 6, wherein the dielectric multilayer reflector stack comprises alternating layers of two dielectric materials chosen from a group consisting of silicon, silicon oxide, silicon nitride, and silicon oxynitride.

9. The apparatus of claim 6, wherein the reflector further comprises at least one metal layer formed directly on the dielectric multilayer reflector stack.

10. The apparatus of claim 9, wherein the metal layer comprises a titanium layer formed directly on the dielectric multilayer reflector stack, a platinum layer formed directly on the titanium layer, and a gold layer formed directly on the platinum layer.

11. The apparatus of claim 9, wherein the metal layer comprises a titanium layer formed directly on the dielectric multilayer reflector stack, and a gold layer formed directly on the titanium layer.

12. An apparatus, comprising:
    a substrate;
    a photodetector formed on an area of a surface of the substrate;
    an electrical contact formed on a portion of the photodetector; and
    a reflector formed over a portion of the photodetector distinct from the portion of the photodetector having the electrical contact formed thereon,
    wherein:
    the substrate, the photodetector, and the reflector are arranged so that an optical signal to be detected is incident on the photodetector from within the substrate, and at least a portion of the optical signal incident on the photodetector and transmitted thereby on a first pass is reflected by the reflector to propagate through the photodetector for a second pass; and
    the reflector comprises a metal layer formed directly on the photodiode.

13. The apparatus of claim 12, wherein the reflector comprises a titanium layer formed directly on the photodiode, and a gold layer formed directly on the titanium layer.

14. The apparatus of claim 5, wherein the dielectric layer comprises silicon nitride, silicon oxide, or silicon oxynitride.

15. The apparatus of claim 5, wherein the metal layer comprises a titanium layer formed directly on the dielectric layer and a gold layer formed directly on the titanium layer.

16. The apparatus of claim 5, wherein the metal layer comprises an aluminum layer formed directly on the dielectric layer.

* * * * *